United States Patent
Tanada

(10) Patent No.: US 9,905,582 B2
(45) Date of Patent: *Feb. 27, 2018

(54) DISPLAY DEVICE

(71) Applicant: Semiconductor Energy Laboratory Co., Ltd., Kanagawa-ken (JP)

(72) Inventor: Yoshifumi Tanada, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/047,941

(22) Filed: Feb. 19, 2016

(65) Prior Publication Data

US 2016/0233238 A1     Aug. 11, 2016

Related U.S. Application Data

(63) Continuation of application No. 14/708,613, filed on May 11, 2015, now Pat. No. 9,276,018, which is a
(Continued)

(30) Foreign Application Priority Data

Jun. 13, 2003   (JP) .................. 2003-170090

(51) Int. Cl.
*G09G 3/30*   (2006.01)
*H01L 27/12*  (2006.01)
(Continued)

(52) U.S. Cl.
CPC ............ *H01L 27/124* (2013.01); *G09G 3/30* (2013.01); *G09G 3/32* (2013.01); *H01L 27/15* (2013.01);
(Continued)

(58) Field of Classification Search
CPC ......... G09G 2300/0842; G09G 3/3233; G09G 2320/0626; G09G 2300/0404; G09G 2300/0426; H01L 2924/0002
(Continued)

(56) References Cited

U.S. PATENT DOCUMENTS

| | | |
|---|---|---|
| 4,468,659 A | 8/1984 | Ohba et al. |
| 4,937,517 A | 6/1990 | Kurashima |

(Continued)

FOREIGN PATENT DOCUMENTS

| | | |
|---|---|---|
| JP | 04-229529 A | 8/1992 |
| JP | 04-234785 A | 8/1992 |

(Continued)

OTHER PUBLICATIONS

Schenk, H. et al., "Polymers for Light Emitting Diodes," Eurodisplay '99: The 19th International Display Research Conference, Sep. 6, 1999, pp. 33-37.

*Primary Examiner* — Nelson Rosario
*Assistant Examiner* — Chun-Nan Lin
(74) *Attorney, Agent, or Firm* — Husch Blackwell LLP

(57) ABSTRACT

A display device in which the current load of wirings are distributed and display variations due to voltage drop are suppressed. An active matrix display device of the invention comprises a first current input terminal, a second current input terminal, and a plurality of current supply lines extending parallel to each other. Each current supply line is connected to a plurality of driving transistors in a line. One end of each current supply line is connected to the first current input terminal via a first wiring intersecting with the current supply lines, and the other end thereof is connected to the second current input terminal via a second wiring intersecting with the current supply lines. Accordingly, a current is supplied to each current supply line from both the
(Continued)

first and the second current input terminals. The first and the second current input terminals are provided separately from each other.

20 Claims, 9 Drawing Sheets

Related U.S. Application Data continuation of application No. 14/298,292, filed on Jun. 6, 2014, now Pat. No. 9,030,389, which is a continuation of application No. 13/894,722, filed on May 15, 2013, now Pat. No. 8,749,461, which is a continuation of application No. 13/543,110, filed on Jul. 6, 2012, now Pat. No. 8,446,348, which is a continuation of application No. 12/496,206, filed on Jul. 1, 2009, now Pat. No. 8,217,864, which is a continuation of application No. 10/863,877, filed on Jun. 8, 2004, now Pat. No. 7,557,779.

(51) Int. Cl.
*G09G 3/32* (2016.01)
*H01L 33/62* (2010.01)
*H01L 27/15* (2006.01)
*H01L 27/32* (2006.01)

(52) U.S. Cl.
CPC ........ *H01L 27/156* (2013.01); *H01L 27/3211* (2013.01); *H01L 27/3262* (2013.01); *H01L 27/3276* (2013.01); *H01L 33/62* (2013.01); *G09G 2300/0404* (2013.01); *G09G 2300/0426* (2013.01); *G09G 2300/0809* (2013.01); *G09G 2320/0233* (2013.01); *G09G 2320/0242* (2013.01); *G09G 2330/02* (2013.01); *H01L 2924/0002* (2013.01)

(58) Field of Classification Search
USPC .... 345/76–83; 313/343, 396, 498, 500, 506; 315/169.1–169.4
See application file for complete search history.

(56) References Cited

U.S. PATENT DOCUMENTS

| | | |
|---|---|---|
| 5,247,190 A | 9/1993 | Friend et al. |
| 5,399,502 A | 3/1995 | Friend et al. |
| 5,440,208 A | 8/1995 | Uskali et al. |
| 5,670,792 A | 9/1997 | Utsugi et al. |
| 5,831,709 A | 11/1998 | Song |
| 5,965,363 A | 10/1999 | Monforte et al. |
| 6,058,257 A | 5/2000 | Nojima |
| 6,087,885 A | 7/2000 | Tobita |
| 6,127,704 A | 10/2000 | Kim |
| 6,239,958 B1* | 5/2001 | Kato ........................ G11C 7/24 361/56 |
| 6,348,702 B1 | 2/2002 | Takayama et al. |
| 6,421,034 B1 | 7/2002 | Mihara |
| 6,469,317 B1 | 10/2002 | Yamazaki et al. |
| 6,476,419 B1 | 11/2002 | Yasuda |
| 6,512,504 B1 | 1/2003 | Yamauchi et al. |
| 6,522,079 B1 | 2/2003 | Yamada |
| 6,524,895 B2 | 2/2003 | Yamazaki et al. |
| 6,528,950 B2 | 3/2003 | Kimura |
| 6,529,178 B1 | 3/2003 | Kimura |
| 6,531,713 B1 | 3/2003 | Yamazaki |
| 6,545,359 B1 | 4/2003 | Ohtani et al. |
| 6,548,960 B2 | 4/2003 | Inukai |
| 6,556,177 B1 | 4/2003 | Katayama et al. |
| 6,559,594 B2 | 5/2003 | Fukunaga et al. |
| 6,577,302 B2 | 6/2003 | Hunter et al. |
| 6,580,408 B1 | 6/2003 | Bae et al. |
| 6,580,409 B1 | 6/2003 | Ito et al. |
| 6,583,577 B1 | 6/2003 | Choi et al. |
| 6,618,029 B1 | 9/2003 | Ozawa |
| 6,633,270 B2 | 10/2003 | Hashimoto |
| 6,714,178 B2 | 3/2004 | Koyama et al. |
| 6,724,149 B2 | 4/2004 | Komiya et al. |
| 6,781,153 B2 | 8/2004 | Anzai |
| 6,864,638 B2 | 3/2005 | Ishihara et al. |
| 6,876,346 B2 | 4/2005 | Anzai et al. |
| 6,888,520 B2* | 5/2005 | Ouchi ................ H01L 27/3248 315/169.3 |
| 6,947,019 B2* | 9/2005 | Sato ..................... G09G 3/3233 315/169.3 |
| 7,009,345 B2 | 3/2006 | Komiya et al. |
| 7,009,589 B1 | 3/2006 | Komiya et al. |
| 7,015,884 B2 | 3/2006 | Kwon |
| 7,050,038 B2* | 5/2006 | Matsuda .............. G02F 1/1345 345/100 |
| 7,068,246 B2 | 6/2006 | Yamazaki et al. |
| 7,148,630 B2 | 12/2006 | Koyama et al. |
| 7,164,155 B2 | 1/2007 | Yamazaki et al. |
| 7,221,337 B1 | 5/2007 | Choi et al. |
| 7,230,592 B2 | 6/2007 | Sato et al. |
| 7,248,235 B2 | 7/2007 | Fujii et al. |
| 7,301,276 B2* | 11/2007 | Yamazaki .......... H01L 27/3281 313/498 |
| 7,301,520 B2 | 11/2007 | Koyama et al. |
| 7,394,446 B2 | 7/2008 | Park |
| 7,397,451 B2 | 7/2008 | Ozawa |
| 7,460,094 B2 | 12/2008 | Ozawa |
| 7,557,779 B2 | 7/2009 | Tanada |
| 8,125,415 B2 | 2/2012 | Koyama et al. |
| 8,310,475 B2 | 11/2012 | Ozawa |
| 8,310,476 B2 | 11/2012 | Ozawa |
| 8,446,348 B2 | 5/2013 | Tanada |
| 8,749,461 B2 | 6/2014 | Tanada |
| 2001/0043168 A1 | 11/2001 | Koyama et al. |
| 2003/0038594 A1 | 2/2003 | Seo et al. |
| 2003/0076046 A1 | 4/2003 | Komiya et al. |
| 2003/0127651 A1 | 7/2003 | Murakami et al. |
| 2003/0137253 A1 | 7/2003 | Kimura |
| 2003/0151568 A1 | 8/2003 | Ozawa |
| 2003/0209990 A1* | 11/2003 | Kawasaki .......... G09G 3/3233 315/169.3 |
| 2004/0000865 A1 | 1/2004 | Yamazaki |
| 2004/0135175 A1 | 7/2004 | Kurokawa |
| 2005/0127366 A1* | 6/2005 | Jeong ............... G02F 1/136227 257/72 |
| 2005/0156509 A1 | 7/2005 | Yamazaki et al. |
| 2008/0042584 A1* | 2/2008 | Ohtani ................ G02B 27/017 315/169.3 |
| 2008/0158209 A1 | 7/2008 | Ozawa |
| 2009/0289931 A1* | 11/2009 | Matsueda .......... G09G 3/3233 345/211 |
| 2012/0153293 A1 | 6/2012 | Koyama et al. |

FOREIGN PATENT DOCUMENTS

| | | |
|---|---|---|
| JP | 04-250492 A | 9/1992 |
| JP | 06-176868 A | 6/1994 |
| JP | 08-129158 A | 5/1996 |
| JP | 08-171081 A | 7/1996 |
| JP | 09-081053 A | 3/1997 |
| JP | 09-114398 A | 5/1997 |
| JP | 09-260061 A | 10/1997 |
| JP | 09-281928 A | 10/1997 |
| JP | 10-092576 A | 4/1998 |
| JP | 10-239699 A | 9/1998 |
| JP | 10-247735 A | 9/1998 |
| JP | 2000-132133 A | 5/2000 |
| JP | 2000-242196 A | 9/2000 |
| JP | 2002-032037 A | 1/2002 |
| JP | 2002-040961 A | 2/2002 |
| JP | 2002-108252 A | 4/2002 |
| JP | 2003-108068 A | 4/2003 |
| WO | WO 90/13148 A1 | 11/1990 |

* cited by examiner

US 9,905,582 B2

DISPLAY DEVICE

This application is a continuation of copending application Ser. No. 14/708,613 filed on May 11, 2015 which is a continuation of application Ser. No. 14/298,292 filed on Jun. 6, 2014 (now U.S. Pat. No. 9,030,389 issued May 12, 2015) which is a continuation of application Ser. No. 13/894,722 filed on May 15, 2013 (now U.S. Pat. No. 8,749,461 issued Jun. 10, 2014) which is a continuation of application Ser. No. 13/543,110 filed on Jul. 6, 2012 (now U.S. Pat. No. 8,446,348 issued May 21, 2013) which is a continuation of application Ser. No. 12/496,206 filed on Jul. 1, 2009 (now U.S. Pat. No. 8,217,864 issued Jul. 10, 2012) which is a continuation of application Ser. No. 10/863,877 filed on Jun. 8, 2004 (now U.S. Pat. No. 7,557,779 issued Jul. 7, 2009), which are all incorporated herein by reference.

BACKGROUND OF THE INVENTION

1. Field of the Invention

The present invention relates to an active matrix display device, and more particularly, relates to a wiring structure of an active matrix display device comprising a light emitting element.

2. Description of the Related Art

In recent years, a large sized electro luminescence (abbreviated as EL hereinafter) display device has been developed with a view to entry into the television market.

As the length of a wiring is increased with enlargement of a display device, voltage drop occurs. The voltage drop becomes a problem particularly in a current supply line for supplying a current to a light emitting element.

This is because the voltage drop causes display variations since a voltage applied to an EL element varies among each region.

SUMMARY OF THE INVENTION

The invention provides a display device in which display variations due to voltage drop are suppressed by distributing the current load of wirings.

A display device of the invention is an active matrix display device comprising a first current input terminal, a second current input terminal and a plurality of current supply lines which extend parallel to each other. Each of the current supply lines is connected to a plurality of driving transistors arranged in a line. One end of each of the current supply lines is connected to the first current input terminal via a first wiring which extends in a direction intersecting with the current supply lines. The other end of each of the current supply lines is connected to the second current input terminal via a second wiring which extends in a direction intersecting with the current supply lines. Accordingly, a current is supplied to each of the current supply lines from both the first current input terminal and the second current input terminal. It is to be noted that the first current input terminal and the second current terminal are provided separately from each other.

The current supply line in this specification is a wiring connected to a transistor (driving transistor) for supplying a current to a light emitting element in a light emitting display device in particular. Current supply to the light emitting element from the current supply line is controlled by turning the driving transistor ON or OFF.

Note that, the first wiring may be connected to a plurality of the first current input terminals. Similarly, the second wiring may be connected to a plurality of the second current input terminals.

According to the display device having the aforementioned structure, the current load can be distributed to a node between the first wiring and a wiring directly connected to the first current input terminal and to a node between the second wiring and a wiring directly connected to the second current input terminal, thereby suppressing voltage drop at the current supply lines.

A display device of the invention is an active matrix display device comprising a plurality of current supply lines which extend parallel to each other and a plurality wirings which extend in a direction intersecting with the current supply lines. The current supply lines are electrically connected to the wirings at each intersection of the current supply lines and the wirings. It is to be noted that the current supply lines and the wirings are formed on different layers with an insulating layer interposed therebetween. Further, a connecting portion provided in the insulating layer allows the current supply lines to be electrically connected to the wirings.

According to the display device having the aforementioned structure, a current can be supplied to each light emitting element via a plurality of current paths, thereby distributing the current load. As a result, voltage drop at a current supply line can be suppressed.

In the case of a display device comprising a plurality of light emitting elements which emit different color light, the aforementioned structure may be adopted for each group of current supply lines which supply a current to light emitting elements emitting the same color light.

Drop in voltage can be suppressed in such a manner, and thus a display device in which display variations due to voltage drop are suppressed can be achieved.

DETAILED DESCRIPTION OF THE INVENTION

Embodiment Mode 1

An embodiment mode of the invention is described with reference to FIGS. 1A and 1B.

Figure 1A:
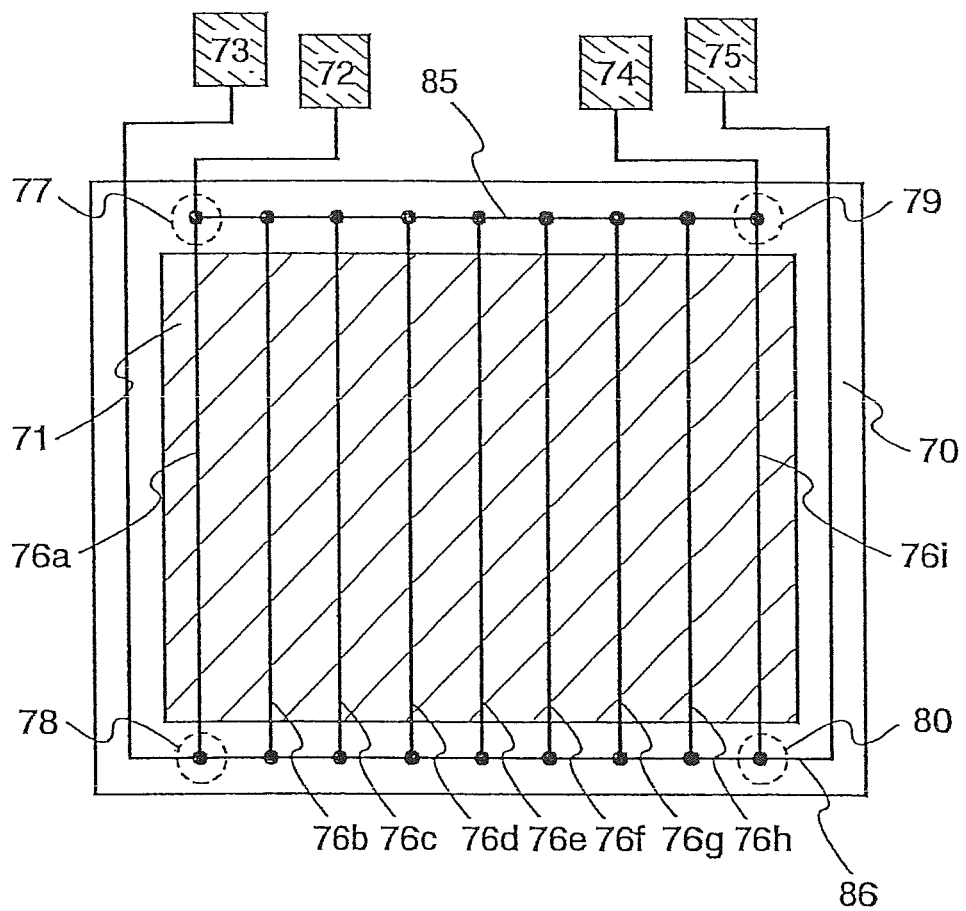
FIGS. 1A and 1B are diagrams showing the invention.

FIG. 1A is a pattern diagram showing current supply lines which are led out, among a plurality of wirings provided in the active matrix display device of the invention.

Figure 1B:
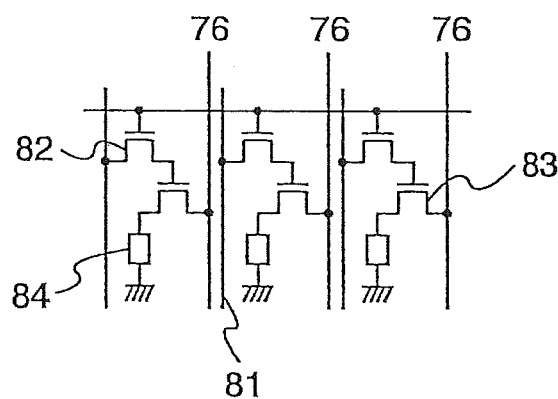

A pixel portion 71 formed on a substrate 70 comprises a plurality of pixels each having a switching transistor 82, a driving transistor 83 and a light emitting element 84 as shown in FIG. 1B. Further, reference numeral 81 denotes a source line and 76 denotes a current supply line in FIG. 1B. It is assumed in this embodiment mode that the light emitting element 84 in each pixel emits the same color light.

A plurality of current supply lines 76a to 76i provided on the substrate 70 extend in one direction and parallel to each other. The current supply lines 76a to 76i are connected to a wiring 85 which extends substantially perpendicular to the current supply lines 76a to 76i, and connected to a first current input terminal 72 or 74 via a node 77 or 79 which is provided at the ends of the wiring 85. It is to be noted that the first current input terminals 72 and 74 are provided separately from each other.

The opposite ends of the current supply lines 76a to 76i connected to the wiring 85 are connected to a wiring 86 which extends substantially perpendicular to the current supply lines 76a to 76i, and connected to a second current input terminal 73 or 75 via a node 78 or 80 which is provided at the ends of the wiring 86. It is to be noted that the second current input terminals 73 and 75 are provided separately from each other.

In the display device having the aforementioned structure, an electrical signal is transmitted to each of the current supply lines 76a to 76i from the first current input terminals 72 and 74 and the second current input terminals 73 and 75 which are provided separately from each other.

In such a manner, a current is inputted to a current supply line from first and second current input terminals provided separately. According to this, the current load of the nodes 77 and 79 are distributed to the nodes 78 and 80, and significant voltage drop can thus be prevented from occurring locally.

Although the display device of monochrome light emission is shown in this embodiment mode, the invention may be applied to a display device of three color emission of RGB. In the latter case, the structure shown in this embodiment mode may be adopted for each color emission. Further, a circuit configuration of the pixel portion for driving the light emitting element is not especially limited.

Embodiment Mode 2

An embodiment mode of the invention is described with reference to FIGS. 2 and 3.

Figure 2:
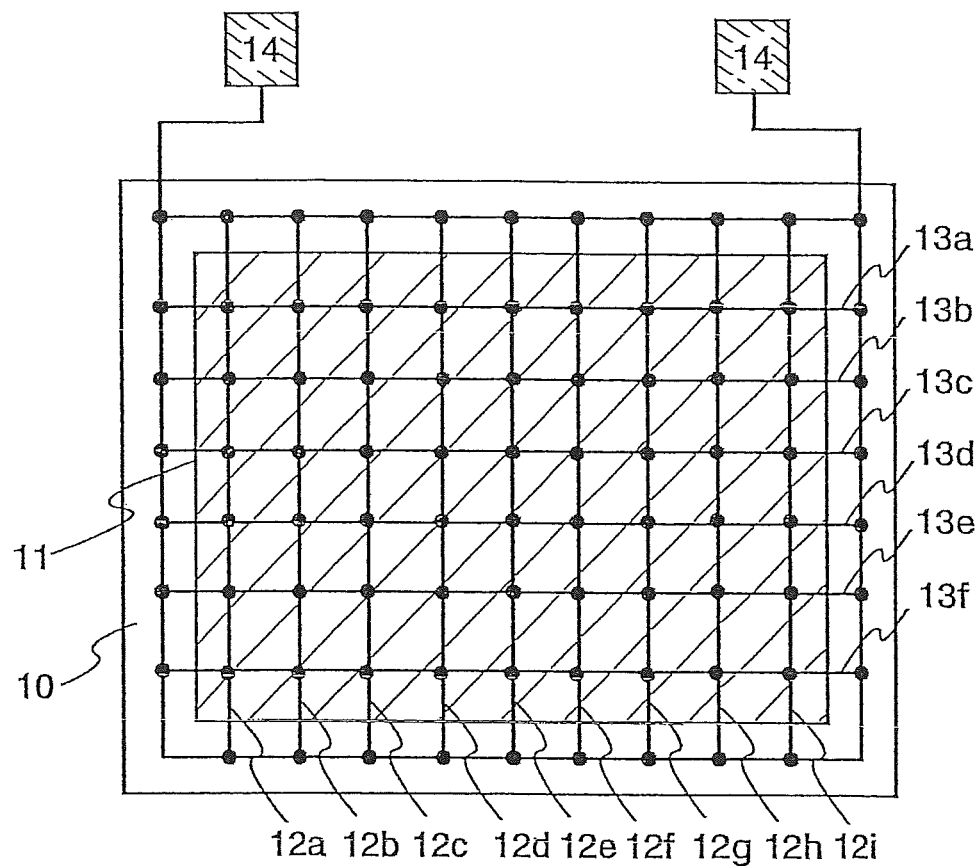
FIG. 2 is a diagram showing the invention.

FIG. 2 is a pattern diagram showing current supply lines which are led out, among a plurality of wirings provided in the active matrix display device of the invention. FIG. 3 is a diagram showing a circuit configuration of the pixel portion of the display device shown in FIG. 2.

In FIG. 2, a pixel portion 11 formed on a substrate 10 comprises current supply lines 12a to 12i arranged in columns. Wirings 13a to 13f are arranged so as to intersect with the current supply lines 12a to 12i arranged in columns, and the wirings 13a to 13f are connected to the current supply lines 12a to 12i at intersections of the wirings 13a to 13f and the current supply lines 12a to 12i. Further, the current supply lines 12a to 12i are connected to current input terminals 14.

Figure 3:
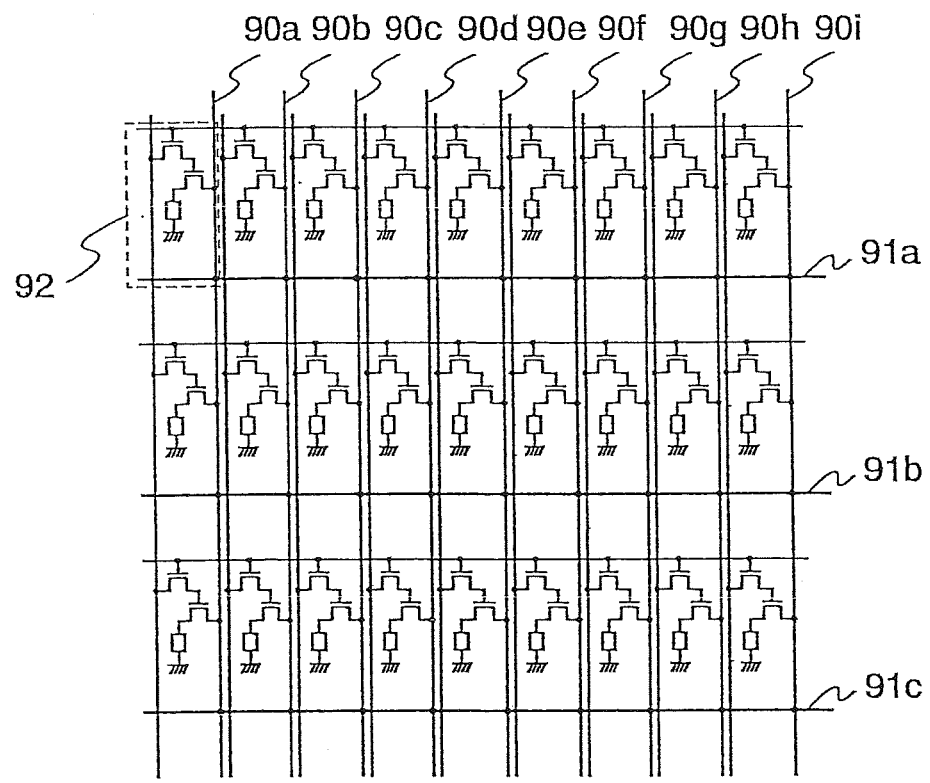
FIG. 3 is a diagram showing the invention.

In FIG. 3, the pixel portion 11 of the display device comprises a plurality of current supply lines 90a to 90i arranged in a longitudinal direction and a plurality of wirings 91a to 91c arranged in a lateral direction. An area surrounded by two longitudinally adjacent current supply lines and two laterally adjacent wirings corresponds to one pixel.

A pixel 92 comprises a switching transistor, a driving transistor and a light emitting element. The driving transistor provided in each pixel is connected to each of the current supply lines 90a to 90i. It is to be noted that all the light emitting elements emit the same color light in this embodiment mode.

Via the wirings 91a to 91c which extend substantially perpendicular to the current supply lines 90a to 90i, each of the current supply lines 90a to 90i is electrically connected to the adjacent current supply line, for example, such that the current supply lines 90a and 90b are connected to each other, the current supply lines 90b and 90c are connected each other, and the like.

As set forth above, the current supply lines are electrically connected to each other both in the longitudinal and the lateral directions per pixel. Therefore, the number of current paths is increased to distribute the current load, which prevents significant voltage drop from occurring locally.

Although the display device of monochrome light emission is shown in this embodiment mode, the invention may be applied to a display device of three color emission of RGB. In the latter case, the structure shown in this embodiment mode may be adopted for each color emission. Further, a circuit configuration of the pixel portion for driving the light emitting element is not especially limited.

The circuit configuration shown in this embodiment mode can be implemented in combination with that shown in Embodiment Mode 1 in order to still suppress the current load.

EMBODIMENT

Embodiment 1

Figure 5:
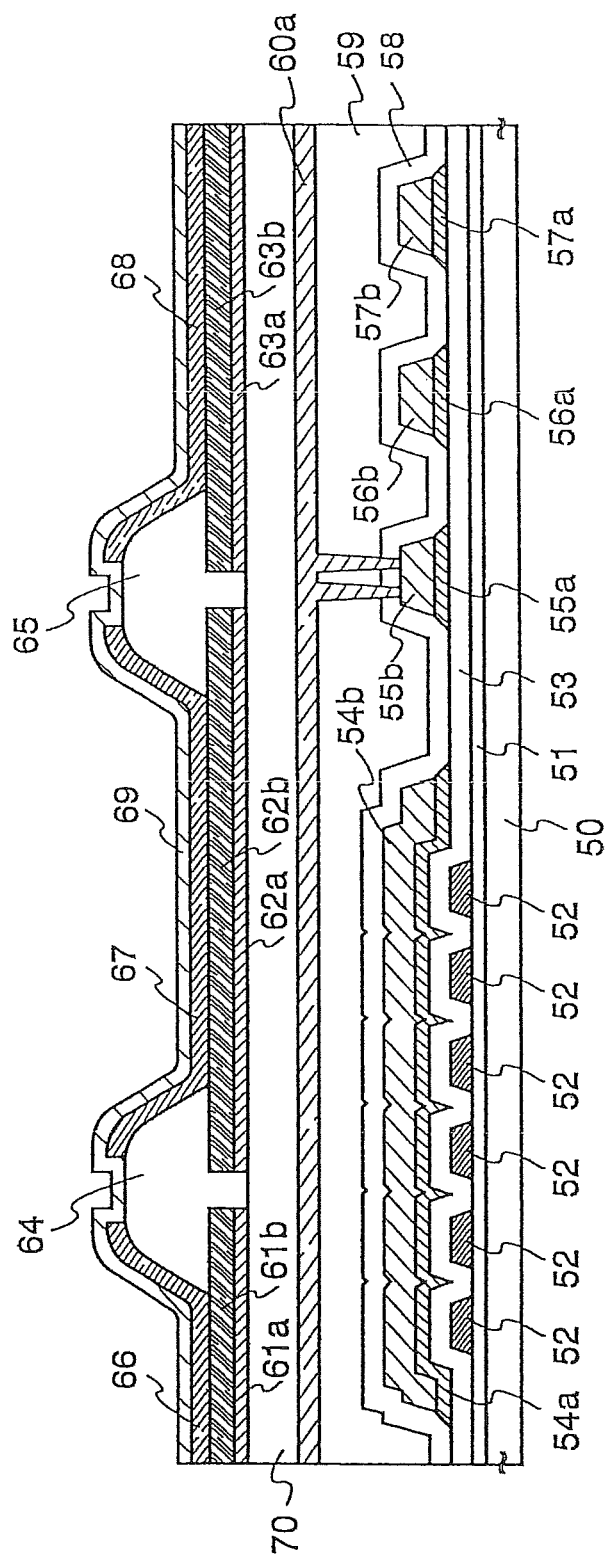
FIG. 5 is a cross sectional view of a pixel portion of the display device according to the invention.
Figure 6:
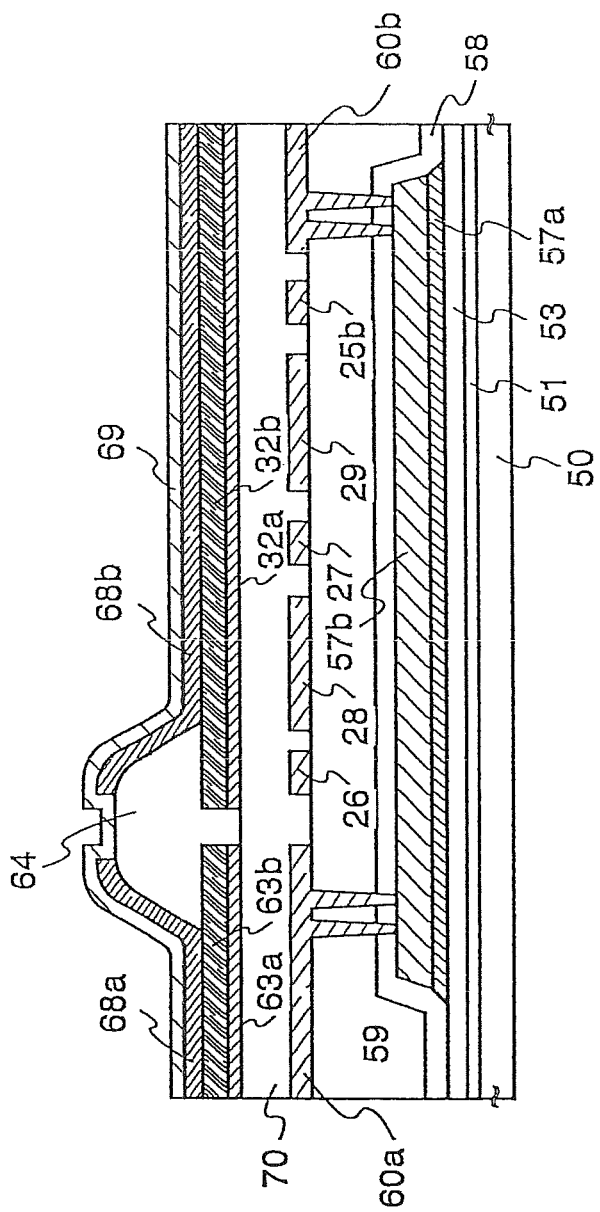
FIG. 6 is a cross sectional view of a pixel portion of the display device according to the invention.
Figure 7:
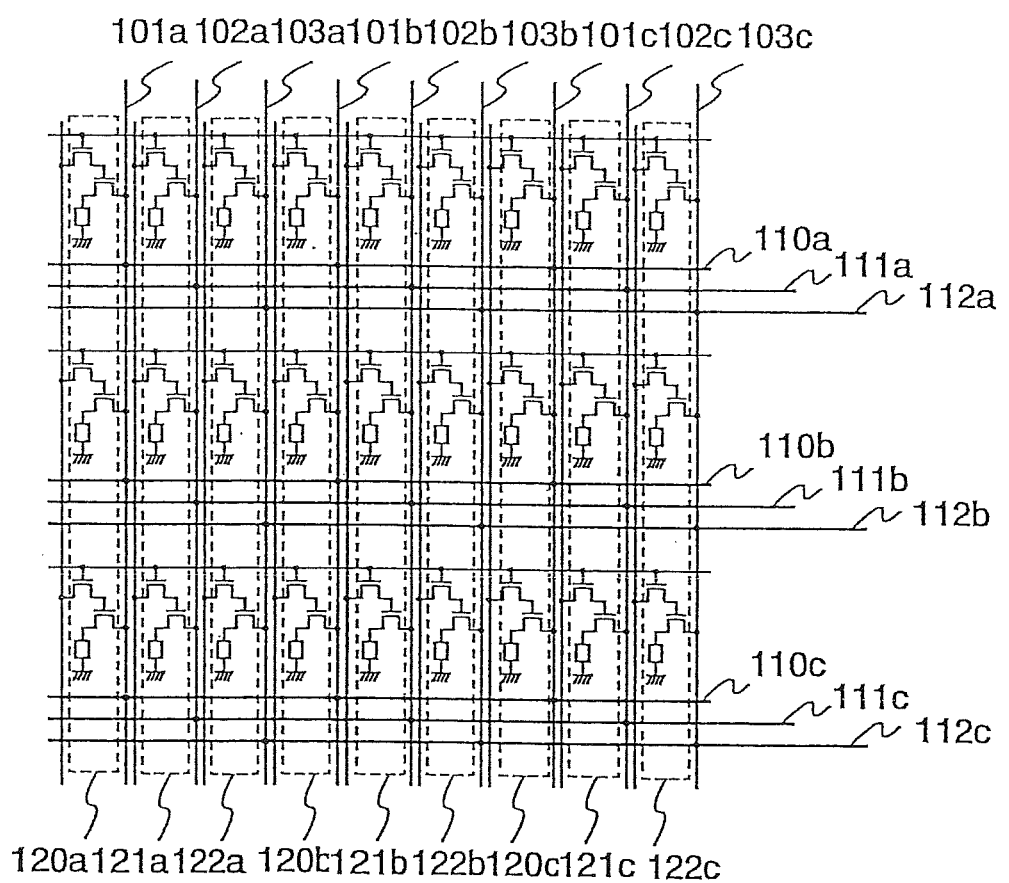
FIG. 7 is a diagram showing the invention.

A display device using the invention is described with reference to FIGS. 4 to 7. Note that, the display device shown in this embodiment adopts the structures described in both Embodiment Modes 1 and 2. FIG. 7 is a diagram showing a circuit configuration of a pixel portion of the display device according to this embodiment.

Figure 4:
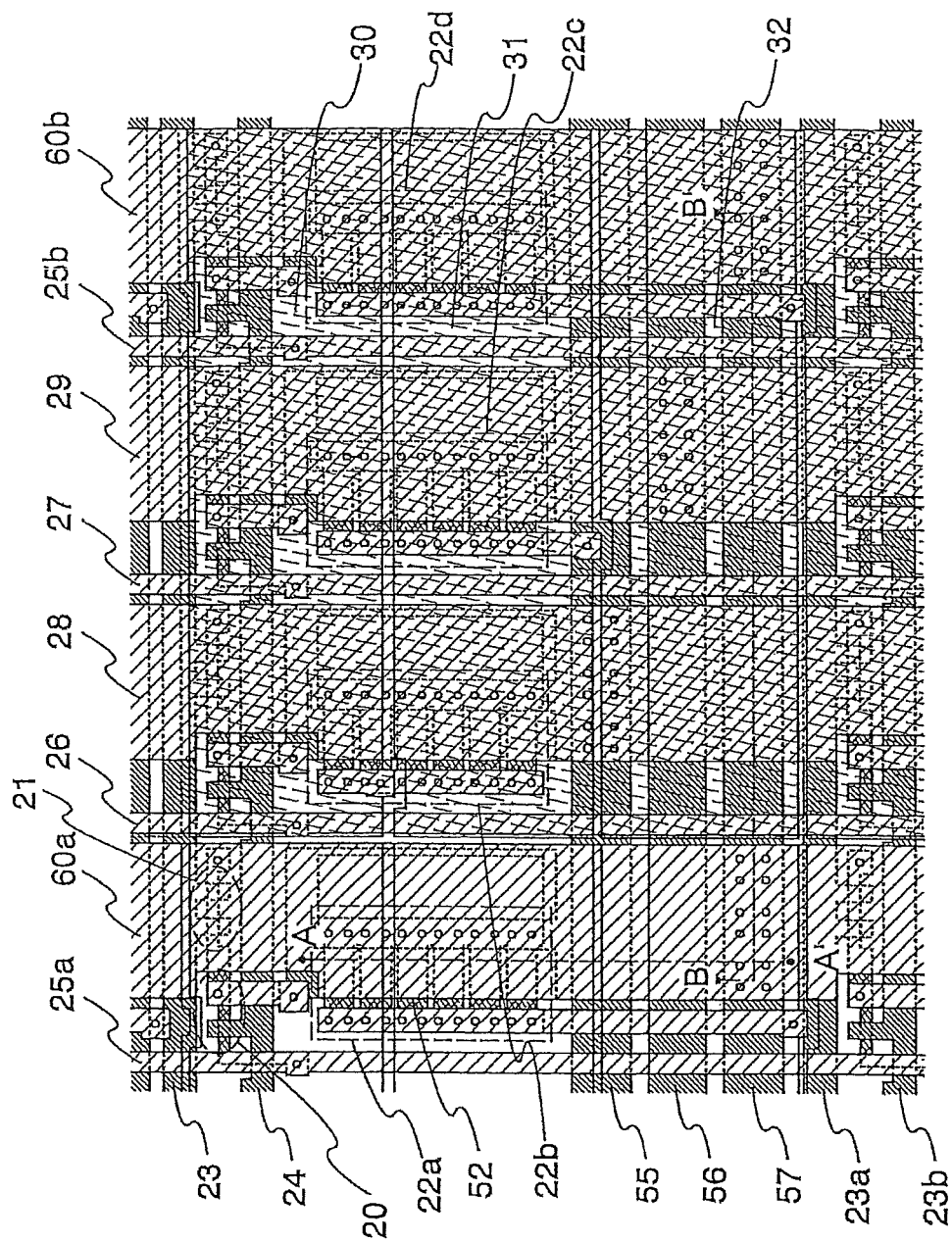
FIG. 4 is a top plan view of a pixel portion of a display device according to the invention.

FIG. 4 is a top plan view showing a part of a pixel portion of the display device according to the invention. FIG. 5 is a cross sectional view taken by cutting along a line A-A' of FIG. 4, whereas FIG. 6 is a cross sectional view taken by cutting along a line B-B' of FIG. 4.

A display device of this embodiment comprises a plurality of pixels using as a unit light emitting elements each of which emits red, green or blue light. Each of the pixels comprises a driving transistor 22 for driving the light emitting element, a switching transistor 20, an erasing transistor 21, a current supply line 28, source lines 25a and 25b, a first scan line (erasing line) 23, and a second scan line (gate line) 24. In the display device, the pixels are arranged in matrix.

Electrodes 30 and 61 (61a and 61b) of a light emitting element are electrodes of a light emitting element which emits red light, electrodes 31 and 62 (62a and 62b) of a light emitting element are electrodes of a light emitting element which emits green light, and electrodes 32 and 63 (63a and 63b) of a light emitting element are electrodes of a light emitting element which emits blue light. An electrode 69 of a light emitting element is provided so as to face the electrodes 61, 62 and 63 of the light emitting elements with light emitting layers 66, 67 and 68 respectively interposed therebetween.

The light emitting element which emits red light is connected to a current supply line 28 via the driving transistor 22b, the light emitting element which emits green light is connected to a current supply line 29 via the driving transistor 22c, and the light emitting element which emits blue light is connected to current supply lines 60a and 60b via the driving transistor 22a and 22d, respectively. The current supply lines 28, 29, 60a, and 60b extend parallel to each other. The current supply lines 60a and 60b are provided in different pixels and electrically connected to each other via third wirings 57 (57a and 57b). It is to be noted that the current supply lines 60a and 60b, and the third wirings 57 (57a and 57b) are formed on different layers with first interlayer insulating layers 58 and 59 interposed therebetween, and electrically connected to each other via a connecting portion provided in the first interlayer insulating layers 58 and 59.

Via first wirings 55 (55a and 55b), the current supply line 28 is electrically connected to a current supply line which is included in a pixel unit laterally adjacent to a pixel unit including the current supply line 28 and which is connected to the light emitting element emitting red light via the driving transistor. Similarly, via second wirings 56 (56a and 56b), the current supply line 29 is electrically connected to a current supply line which is included in a pixel unit laterally adjacent to a pixel unit including the current supply line 29 and which is connected to the light emitting element emitting green light via the driving transistor.

Reference numeral 50 denotes a substrate, 52 denotes a semiconductor layer, 25a, 25b, 26, and 27 denote source lines, 23 denotes a first scan line, 24 denotes a second scan line, 53 denotes a gate insulating layer, and 64 and 65 denote banks.

In FIG. 7, current supply lines 101a to 101c, 102a to 102c and 103a to 103c intersect with wirings 110a to 110c, 111a to 111c and 112a to 112c. The current supply lines 101a to 101c are electrically connected to the wirings 110a to 110c, and 102a to 102c are electrically connected to 111a to 111c, further, 103a to 103c are electrically connected to 112a to 112c. Reference numerals 120a to 120c denote areas including light emitting elements which emit red light, 121a to 121c denote areas including light emitting elements which emit green light, and 122a to 122c denote areas including light emitting elements which emit blue light.

As set forth above, in the display device according to the invention, current supply lines which are connected to light emitting elements emitting the same color light (via a driving transistor) are electrically connected to each other both in the longitudinal and the lateral directions.

Therefore, the number of current paths through which a current from a current input terminal flows is increased, thereby distributing the current load. Further, significant voltage drop can be prevented from occurring locally.

Embodiment 2

A display device using the invention is described with reference to FIGS. 8 and 9A to 9F.

Figure 8:
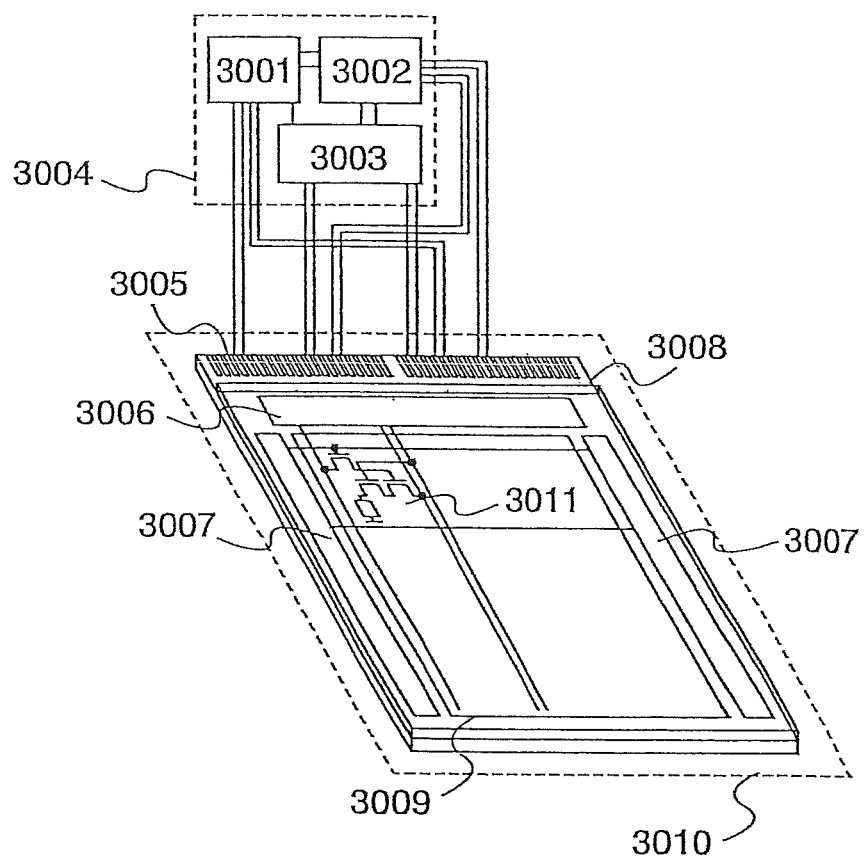
FIG. 8 is a diagram showing the display device using the invention.

As shown in FIG. 8, an active matrix display device comprises an external circuit 3004 and a panel 3010. The external circuit 3004 includes an A/D converter unit 3001, a power supply unit 3002 and a signal generation unit 3003. A video data signal inputted in an analog manner is converted to a digital signal in the A/D converter unit 3001, and supplied to a signal line driver circuit 3006. The power supply unit 3002 generates power having a desired voltage value from power of battery and outlet, and supplies the generated power to the signal line driver circuit 3006, a scan line driver circuit 3007, a light emitting element 3011, the signal generation unit 3003 and the like. The signal generation unit 3003 converts various inputted signals such as a power supply, a video signal and a synchronizing signal, as well as generating a clock signal and the like for driving the signal line driver circuit 3006 and the scan line driver-circuit 3007.

Signals and power supplies from the external circuit 3004 are inputted to an internal circuit and the like via an FPC and an FPC connecting portion 3005 provided in the panel 3010.

A glass substrate 3008 is provided on the panel 3010, and on the glass substrate 3008, the FPC connecting portion 3005, the internal circuit and the light emitting element 3011 are formed. The internal circuit includes the signal line driver circuit 3006, the scan line driver circuit 3007 and a pixel portion 3009. The pixel configuration described in Embodiment Mode 1 is adopted as an example in FIG. 8, however, any one of the pixel configurations described in embodiment modes of the invention can be applied to the pixel portion 3009.

The pixel portion 3009 is arranged at the center of the substrate 3008, and the signal line driver circuit 3006 and the scan line driver circuit 3007 are arranged at the periphery thereof. The light emitting element 3011 and a counter electrode of the light emitting element 3011 are formed over the whole surface of the pixel portion 3009.

FIGS. 9A to 9F show examples of electronic apparatuses including the display device shown in FIG. 8.

Figure 9A:
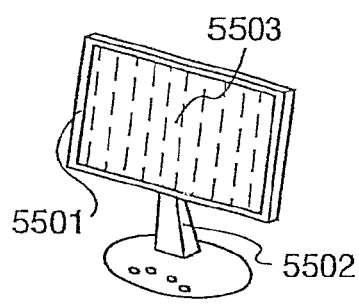
FIGS. 9A to 9F are views showing electronic apparatuses using the invention.

FIG. 9A shows a display device which includes a housing 5501, a supporting base 5502, a display portion 5503 and the like. The display device of the invention can be applied to the display portion 5503.

Figure 9B:
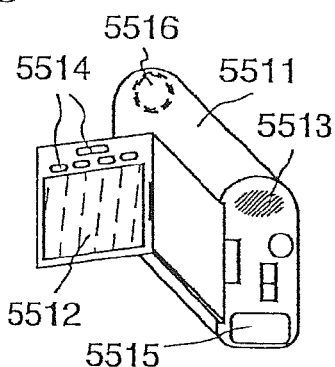

FIG. 9B shows a video camera which includes a main body 5511, a display portion 5512, an audio input portion 5513, operating switches 5514, a battery 5515, an image receiving portion 5516 and the like.

Figure 9C:
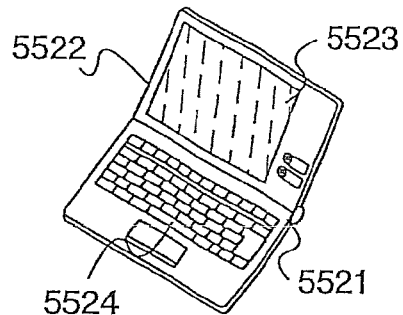

FIG. 9C shows a notebook personal computer using the invention, which includes a main body 5521, a housing 5522, a display portion 5523, a keyboard 5524 and the like.

Figure 9D:
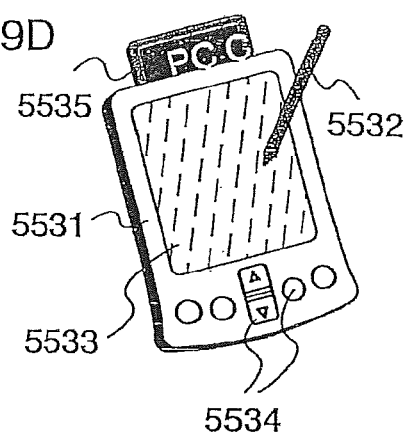

FIG. 9D shows a portable information terminal (PDA) using the invention, which includes a main body 5531 having a display portion 5533, an external interface 5535, operating switches 5534 and the like. Further, a stylus 5532 is provided as an attachment for operation.

Figure 9E:
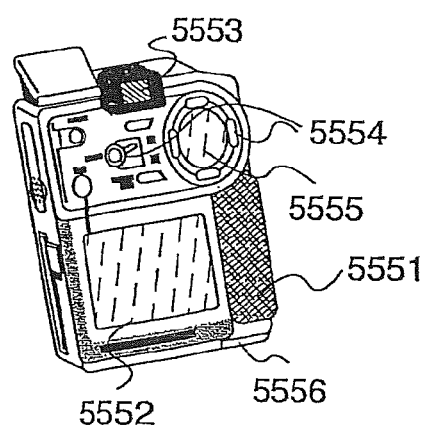

FIG. 9E shows a digital camera which includes a main body 5551, a display portion A 5552, an eye contacting portion 5553, operating switches 5554, a display portion B 5555, a battery 5556 and the like.

Figure 9F:
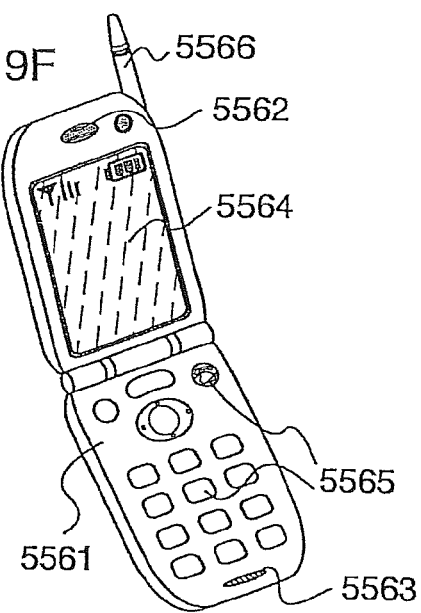

FIG. 9F shows a mobile phone using the invention, which includes a main body 5561 having a display portion 5564, an audio output portion 5562, operating switches 5565, an antenna 5566 and the like.

According to the display device described above, display variations due to voltage drop are suppressed, leading to improved image quality. Further, image quality of electronic apparatuses including such a display device can also be enhanced.

According to the invention, the current load of wirings for transmitting an electrical signal to each pixel of a display device can be distributed, thereby preventing significant voltage drop from occurring locally. Further, display variations due to voltage drop are suppressed.

This application is based on Japanese Patent Application serial no. 2003-170090 filed in Japan Patent Office on 13 Jun. 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A display device comprising:
   a pixel portion;
   a gate line extending in a first direction at least in the pixel portion;
   a wiring including a first portion at least in the pixel portion;
   an insulating layer over the gate line and the wiring;
   a first contact hole and a second contact hole in the insulating layer, wherein the first contact hole and the second contact hole are arranged in a second direction;
   a source line over the insulating layer, wherein the source line intersects with the gate line and the wiring;
   a current supply line including a second portion over the insulating layer, wherein the current supply line intersects with the gate line and the wiring; and
   a transistor comprising a gate, a source and a drain,
   wherein the gate of the transistor is electrically connected to the gate line,
   wherein one of the source and the drain of the transistor is electrically connected to the source line,
   wherein the current supply line is electrically connected to the wiring through the first contact hole and the second contact hole at an intersection of the current supply line and the wiring,
   wherein the first direction and the second direction intersect with each other, and
   wherein a width of a cross-section of the wiring in the first portion is different from a width of a cross-section of the current supply line in the second portion.

2. The display device according to claim 1,
   wherein one end of the wiring is electrically connected to a first terminal for inputting current, and
   wherein the other end of the wiring is electrically connected to a second terminal for inputting current.

3. The display device according to claim 1,
   wherein a driving transistor is connected to the current supply line in the pixel portion, and
   wherein a light emitting element is connected to the driving transistor.

4. The display device according to claim 1,
   wherein the wiring is electrically connected to a first light emitting element which emits red light;
   wherein a second wiring parallel to the wiring is electrically connected to a second light emitting element which emits green light; and
   wherein a third wiring parallel to the wiring is electrically connected to a third light emitting element which emits blue light.

5. The display device according to claim 1, further comprising a third contact hole in the insulating layer,
   wherein the current supply line is electrically connected to the wiring through the first contact hole, the second contact hole, and the third contact hole at the intersection of the current supply line and the wiring, and
   wherein the first contact hole and the third contact hole are arranged in the first direction.

6. A display device comprising:
   a pixel portion;
   a gate line extending in a first direction at least in the pixel portion;
   a first wiring including a first portion at least in the pixel portion;
   an insulating layer over the gate line and the first wiring;
   a first contact hole and a second contact hole in the insulating layer, wherein the first contact hole and the second contact hole are arranged in a second direction;
   a source line over the insulating layer, wherein the source line intersects with the gate line and the first wiring;
   a current supply line including a second portion over the insulating layer, wherein the current supply line intersects with the gate line and the first wiring;
   a transistor comprising a gate, a source and a drain; and
   a second wiring disposed outside of the pixel portion,
   wherein the gate of the transistor is electrically connected to the gate line,
   wherein one of the source and the drain of the transistor is electrically connected to the source line,
   wherein the current supply line is electrically connected to the first wiring through the first contact hole and the second contact hole at an intersection of the current supply line and the first wiring,
   wherein the first direction and the second direction intersect with each other,
   wherein a width of a cross-section of the wiring in the first portion is different from a width of a cross-section of the current supply line in the second portion, and
   wherein one end of the current supply line is connected to the second wiring.

7. The display device according to claim 6,
   wherein one end of the first wiring is electrically connected to a first terminal for inputting current, and
   wherein the other end of the first wiring is electrically connected to a second terminal for inputting current.

8. The display device according to claim 6,
   wherein a driving transistor is connected to the current supply line in the pixel portion, and
   wherein a light emitting element is connected to the driving transistor.

9. The display device according to claim 6,
   wherein the first wiring is electrically connected to a first light emitting element which emits red light;
   wherein a third wiring parallel to the first wiring is electrically connected to a second light emitting element which emits green light; and
   wherein a fourth wiring parallel to the first wiring is electrically connected to a third light emitting element which emits blue light.

10. The display device according to claim 6, further comprising a third contact hole in the insulating layer,
    wherein the current supply line is electrically connected to the wiring through the first contact hole, the second contact hole, and the third contact hole at the intersection of the current supply line and the wiring, and
    wherein the first contact hole and the third contact hole are arranged in the first direction.

11. A display device comprising:
    a pixel portion;
    a gate line extending in a first direction at least in the pixel portion;
    a wiring including a first portion at least in the pixel portion;
    an insulating layer over the gate line and the wiring;
    a first contact hole and a second contact hole in the insulating layer, wherein the first contact hole and the second contact hole are arranged in a second direction;
    a source line over the insulating layer, wherein the source line intersects with the gate line and the wiring;
    a current supply line including a second portion over the insulating layer, wherein the current supply line intersects with the gate line and the wiring; and
    a transistor comprising a gate, a source and a drain,
    wherein the gate of the transistor is electrically connected to the gate line, wherein one of the source and the drain of the transistor is electrically connected to the source line, wherein the current supply line is electrically connected to the wiring through the first contact hole and the second contact hole at an intersection of the current supply line and the wiring, wherein the first direction and the second direction intersect with each other, wherein a width of a cross-section of the wiring in the first portion is different from a width of a cross-section of the current supply line in the second portion, and wherein the current supply line and the wiring are formed of the same material.

12. The display device according to claim 11,
wherein one end of the wiring is electrically connected to a first terminal for inputting current, and
wherein the other end of the wiring is electrically connected to a second terminal for inputting current.

13. The display device according to claim 11,
wherein a driving transistor is connected to the current supply line in the pixel portion, and
wherein a light emitting element is connected to the driving transistor.

14. The display device according to claim 11,
wherein the wiring is electrically connected to a first light emitting element which emits red light;
wherein a second wiring parallel to the wiring is electrically connected to a second light emitting element which emits green light; and
wherein a third wiring parallel to the wiring is electrically connected to a third light emitting element which emits blue light.

15. The display device according to claim 11, further comprising a third contact hole in the insulating layer,
wherein the current supply line is electrically connected to the wiring through the first contact hole, the second contact hole, and the third contact hole at the intersection of the current supply line and the wiring, and
wherein the first contact hole and the third contact hole are arranged in the first direction.

16. A display device comprising:
a pixel portion;
a gate line extending in a first direction at least in the pixel portion;
a wiring at least in the pixel portion;
an insulating layer over the gate line and the wiring;
a first contact hole and a second contact hole in the insulating layer, wherein the first contact hole and the second contact hole are arranged in a second direction;
a source line over the insulating layer, wherein the source line intersects with the gate line and the wiring;
a current supply line over the insulating layer, wherein the current supply line intersects with the gate line and the wiring; and
a transistor comprising a gate, a source and a drain,
wherein the gate of the transistor is electrically connected to the gate line,
wherein one of the source and the drain of the transistor is electrically connected to the source line,
wherein the current supply line is electrically connected to the wiring through the first contact hole and the second contact hole at an intersection of the current supply line and the wiring, and
wherein the first direction and the second direction intersect with each other.

17. The display device according to claim 16,
wherein one end of the wiring is electrically connected to a first terminal for inputting current, and
wherein the other end of the wiring is electrically connected to a second terminal for inputting current.

18. The display device according to claim 16,
wherein a driving transistor is connected to the current supply line in the pixel portion, and
wherein a light emitting element is connected to the driving transistor.

19. The display device according to claim 16,
wherein the wiring is electrically connected to a first light emitting element which emits red light;
wherein a second wiring parallel to the wiring is electrically connected to a second light emitting element which emits green light; and
wherein a third wiring parallel to the wiring is electrically connected to a third light emitting element which emits blue light.

20. The display device according to claim 16, further comprising a third contact hole in the insulating layer,
wherein the current supply line is electrically connected to the wiring through the first contact hole, the second contact hole, and the third contact hole at the intersection of the current supply line and the wiring, and
wherein the first contact hole and the third contact hole are arranged in the first direction.

* * * * *